US010567735B2

(12) United States Patent
Ellis et al.

(10) Patent No.: US 10,567,735 B2
(45) Date of Patent: *Feb. 18, 2020

(54) WELLSITE CONTROL EMPLOYING THREE-DIMENSIONAL IMAGING

(71) Applicant: Nabors Drilling Technologies USA, Inc., Houston, TX (US)

(72) Inventors: Brian Ellis, Houston, TX (US); Pradeep Annaiyappa, Houston, TX (US)

(73) Assignee: Nabors Drilling Technologies USA, Inc., Houston, TX (US)

( * ) Notice: Subject to any disclaimer, the term of this patent is extended or adjusted under 35 U.S.C. 154(b) by 1958 days.

This patent is subject to a terminal disclaimer.

(21) Appl. No.: 13/863,929

(22) Filed: Apr. 16, 2013

(65) Prior Publication Data
US 2013/0275100 A1 Oct. 17, 2013

Related U.S. Application Data

(60) Provisional application No. 61/624,776, filed on Apr. 16, 2012.

(51) Int. Cl.
*H04N 13/204* (2018.01)
*E21B 41/00* (2006.01)
(Continued)

(52) U.S. Cl.
CPC .......... *H04N 13/204* (2018.05); *B25J 19/023* (2013.01); *E21B 19/00* (2013.01);
(Continued)

(58) Field of Classification Search
CPC ...... H04N 13/204; B25J 19/023; E21B 19/00; E21B 19/20; E21B 41/00; F16P 3/142; G06F 17/5009
(Continued)

(56) References Cited

U.S. PATENT DOCUMENTS 4,610,005 A * 9/1986 Utasi ................. E21B 45/00
348/135
4,976,143 A 12/1990 Casso
(Continued)

FOREIGN PATENT DOCUMENTS

WO  WO 2007/081628 A2  7/2007
WO  WO 2007/081628 A3  7/2007

OTHER PUBLICATIONS

U.S. Appl. No. 13/863,122, filed Apr. 15, 2013, Ellis.
(Continued)

*Primary Examiner* — Rehana Perveen
*Assistant Examiner* — Justin C Mikowski
(74) *Attorney, Agent, or Firm* — Haynes and Boone, LLP

(57) ABSTRACT

According to one aspect, a three-dimensional model of at least a portion of a wellsite is generated. A three-dimensional camera system is calibrated to the three-dimensional model. A draw-works encoder is calibrated. The motion of a component is monitored. The draw-works encoder is recalibrated based on the monitoring. According to another aspect, three-dimensional imaging data sets are received, the three-dimensional imaging data sets being associated with a control volume in which the portion of the wellsite is disposed. A predefined three-dimensional model is augmented with the three-dimensional imaging data sets. According to another aspect, at least one three-dimensional camera employs a first three-dimensional sensing technology that is different from a second three-dimensional sensing technology employed by at least one other three-dimensional camera. A single three-dimensional model is generated by merging respective three-dimensional imaging data sets. At least one system is controlled using the single three-dimensional model.

31 Claims, 9 Drawing Sheets

(51) Int. Cl.
*B25J 19/02* (2006.01)
*E21B 19/00* (2006.01)
*F16P 3/14* (2006.01)
*E21B 19/20* (2006.01)
*G06F 17/50* (2006.01)

(52) U.S. Cl.
CPC .............. *E21B 19/20* (2013.01); *E21B 41/00* (2013.01); *F16P 3/142* (2013.01); *G06F 17/5009* (2013.01)

(58) Field of Classification Search
USPC .......................................................... 703/2
See application file for complete search history.

(56) References Cited

U.S. PATENT DOCUMENTS

| | | | |
|---|---|---|---|
| 5,107,705 A * | 4/1992 | Wraight | E21B 19/20 348/85 |
| 5,461,905 A | 10/1995 | Penisson | |
| 5,717,455 A * | 2/1998 | Kamewada | G02B 23/2415 348/85 |
| 6,194,860 B1 | 2/2001 | Seelinger et al. | |
| 6,608,913 B1 | 8/2003 | Hinton et al. | |
| 7,163,335 B2 | 1/2007 | Dishaw et al. | |
| 7,313,506 B2 | 12/2007 | Kacyra et al. | |
| 7,327,383 B2 | 2/2008 | Valleriano et al. | |
| 7,357,196 B2 | 4/2008 | Goldman et al. | |
| 8,417,495 B2 | 4/2013 | Dashevskiy | |
| 9,651,711 B1 * | 5/2017 | Olsson | G01V 9/00 |
| 2002/0120401 A1 | 8/2002 | Macdonald et al. | |
| 2004/0226748 A1 * | 11/2004 | Prior | E21B 19/008 175/27 |
| 2008/0062167 A1 * | 3/2008 | Boggs | G06F 17/5004 345/419 |
| 2008/0179094 A1 | 7/2008 | Repin et al. | |
| 2009/0152005 A1 | 6/2009 | Chapman et al. | |
| 2009/0187391 A1 | 7/2009 | Wendt et al. | |
| 2010/0111489 A1 * | 5/2010 | Presler | H04N 5/225 386/278 |
| 2010/0147510 A1 | 6/2010 | Kwok et al. | |
| 2010/0155142 A1 | 6/2010 | Thambynayagam et al. | |
| 2010/0194863 A1 * | 8/2010 | Lopes | G06T 19/00 348/50 |
| 2010/0250139 A1 | 9/2010 | Hobbs et al. | |
| 2010/0312370 A1 * | 12/2010 | Lind | E21B 41/00 700/98 |
| 2011/0157235 A1 * | 6/2011 | Fitzsimmons | G01V 99/00 345/672 |
| 2011/0297395 A1 | 12/2011 | Codesal et al. | |
| 2012/0014218 A1 * | 1/2012 | Houck | G01V 1/28 367/72 |
| 2012/0274664 A1 | 11/2012 | Fagnou | |
| 2013/0236064 A1 * | 9/2013 | Li | G01V 1/30 382/109 |
| 2013/0265409 A1 * | 10/2013 | Tjhang | H04N 5/23206 348/82 |
| 2013/0311147 A1 | 11/2013 | Greenwood | |

OTHER PUBLICATIONS

"Trimble," http://www.trimble.com/3Dlaser-scanning/fx.aspx?dtID-overview&, 1 page, 2013.
"Optech," http://www.optech.ca/i3dprodline-ilris3d.htm, 2 pages, 2013.
International Search Report and Written Opinion issued for PCT/US2013/036793 dated May 27, 2014, 10 pgs.
Office Action issued in U.S. Appl. No. 13/863,112 dated Jul. 13, 2016; 30 pgs.

* cited by examiner

WELLSITE CONTROL EMPLOYING THREE-DIMENSIONAL IMAGING

CROSS-REFERENCE TO RELATED APPLICATION

This application claims the benefit of the filing date of and priority to U.S. Provisional Application No. 61/624,776 filed Apr. 16, 2012, entitled "Device Control Employing Three-Dimensional Imaging," to Brian Ellis, the entire disclosure of which is hereby incorporated herein by reference.

BACKGROUND OF THE DISCLOSURE

Historically on drilling or service rigs, rig crews have positioned slips to set pipe in hole at a certain height, brought in tongs at the right height to latch onto tool joints (or set the height of an iron roughneck), or adjusted the height of mud buckets, pipe dopers, etc. All of this is done because the human eye is needed to identify where the height of the pipe needs to be (slip set) or where it is relative to floor and other equipment that must interact with it. The same can be said for the traditional derrickman or, even with the advent of more automated pipe handling, there is still the need for human intervention to guide and position equipment as there has been no reliable way of knowing where pipe or tubular might be exactly. Likewise it is always difficult to know exactly where all of the equipment is relative to each other so that different pieces of equipment do not run into each other. Existing systems depend on systems knowing and reporting their current location and another system coordinating to make sure that they don't run into each other. This is less than perfect but it is the best that can be done with a calibrated automation control system requiring minimum human intervention. Much has been done with two-dimensional (2D) vision systems, but without depth it has been almost impossible to apply in the wellsite environment because of lighting changes, air/environment changes and variable pieces of equipment that come in and out of view and make a system very complex.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
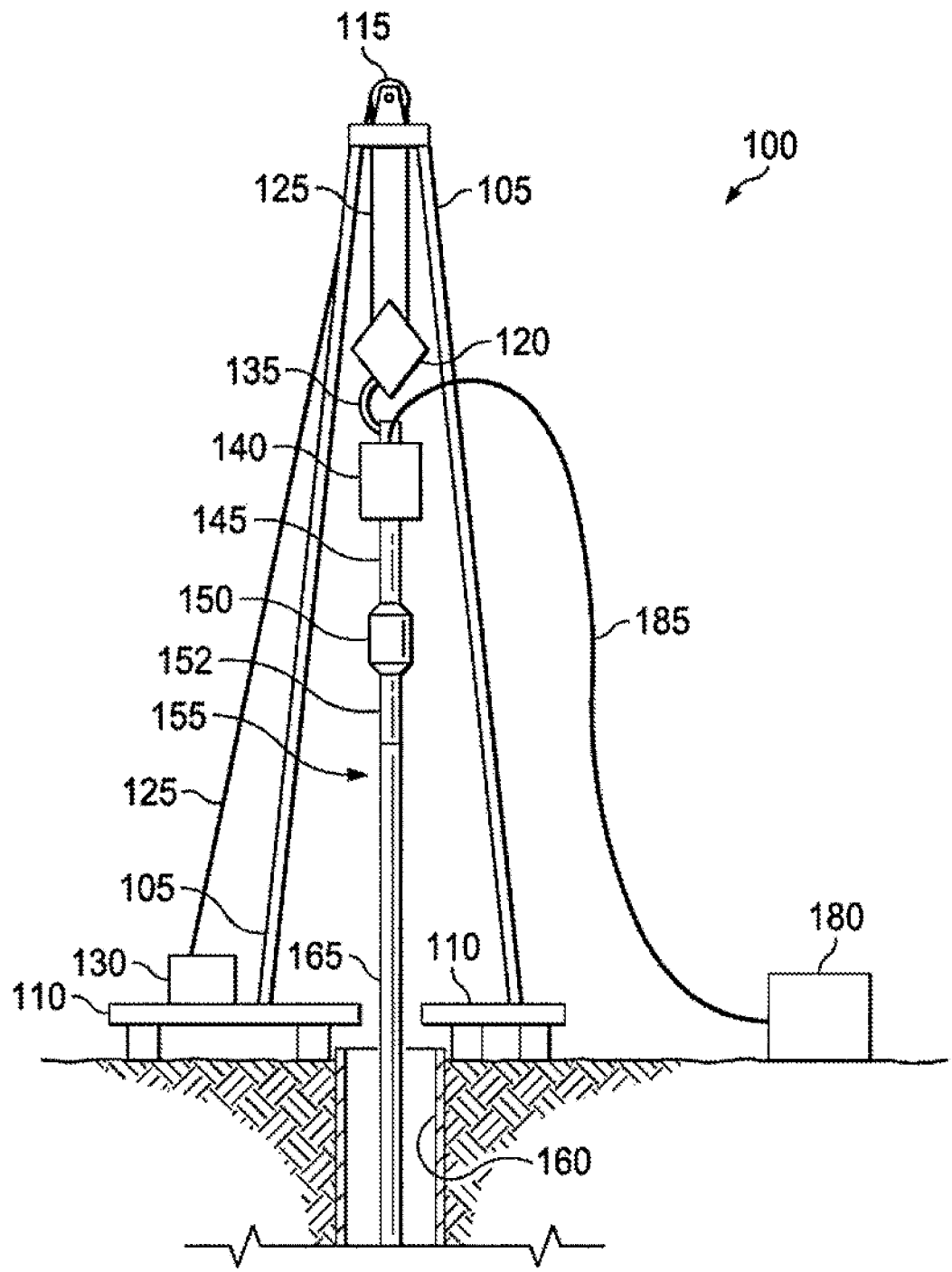
FIG. 1 is a schematic view of conventional apparatus.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a schematic view of apparatus 100. The apparatus 100 demonstrates an exemplary environment in which an apparatus within the scope of the present disclosure may be implemented. The apparatus 100 is or includes a land-based drilling rig. However, one or more aspects of the present disclosure are applicable or readily adaptable to any type of wellsite equipment, such as a drilling rig. The drilling rig may include without limitation one or more jack-up rigs, semisubmersibles, drill ships, coil tubing rigs, and casing drilling rigs, among others. Apparatus 100 includes a mast 105 supporting lifting gear above a rig floor 110. The lifting gear includes a crown block 115 and a traveling block 120. The crown block 115 is coupled at or near the top of the mast 105, and the traveling block 120 hangs from the crown block 115 by a drilling line 125. The drilling line 125 extends from the lifting gear to draw-works 130, which is configured to reel the drilling line 125 out and in to cause the traveling block 120 to be lowered and raised relative to the rig floor 110. A hook 135 may be attached to the bottom of the traveling block 120. A top drive 140 may be suspended from the hook 135. A quill 145 extending from the top drive 140 may be attached to a saver sub 150, which may be attached to a tubular lifting device 152. The tubular lifting device 152 can be engaged with a drill string 155 suspended within and/or above a wellbore 160. The drill string 155 may include one or more interconnected sections of drill pipe 165, among other components. It should be understood that the use of the term "pipe" herein is merely an exemplary type of tubular and that various other types of tubulars (e.g., casing) can often be substituted depending on the desired operation. One or more pumps 180 may deliver drilling fluid to the drill string 155 through a hose or other conduit 185, which may be connected to the top drive 140. The drilling fluid may pass through a central passage of the tubular lifting device 152. In an alternative embodiment, the top drive 140, quill 145 and sub 150 may not be utilized between the hook 125 and the tubular lifting device 152, such as where the tubular lifting device 152 is coupled directly to the hook 125, or where the tubular lifting device 152 is coupled to the hook 125 via other components.

Figure 2:
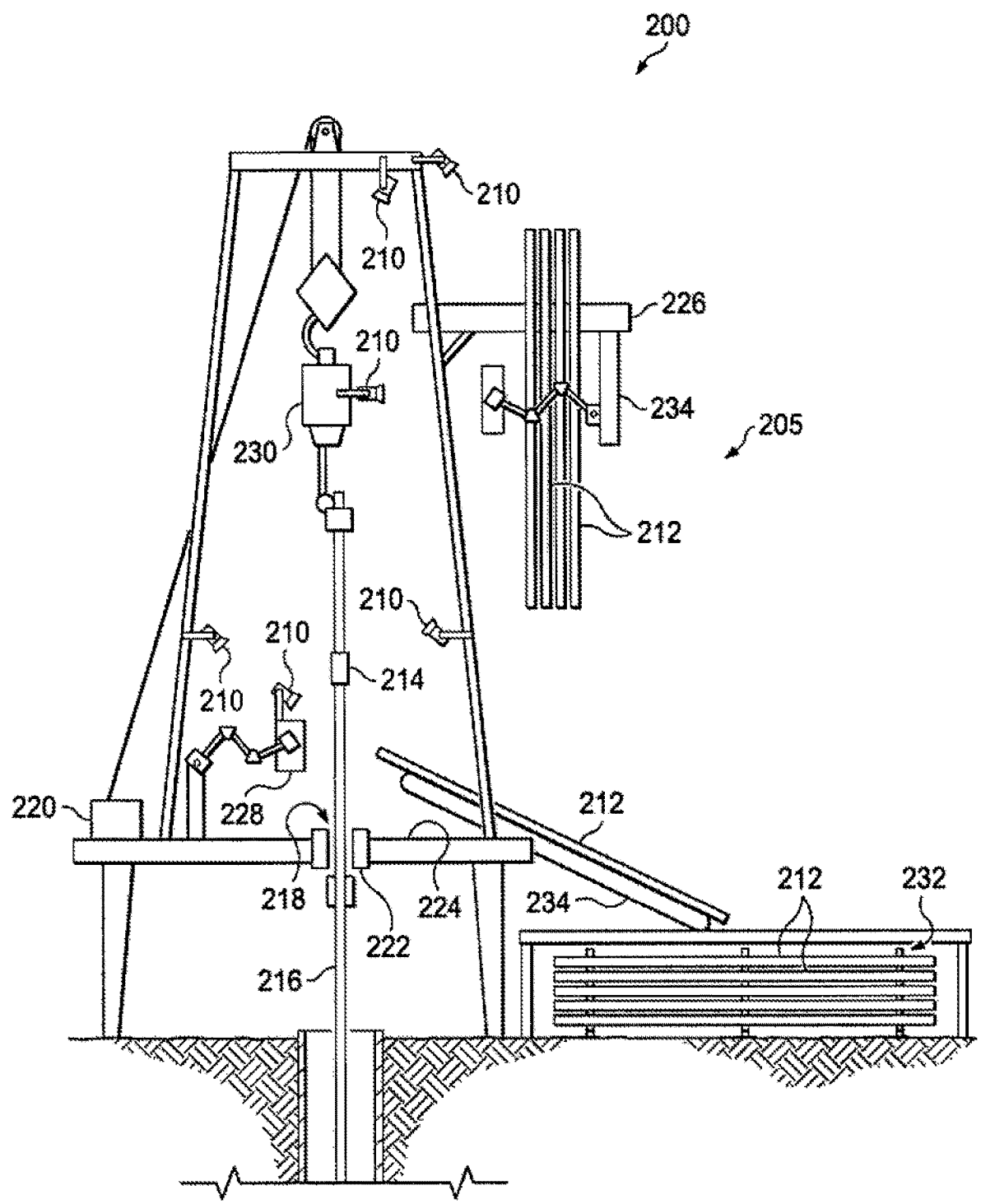
FIG. 2 is a schematic view of apparatus according to one or more aspects of the present disclosure.

Referring to FIG. 2, illustrated is a schematic view of apparatus 200, which is within the scope of the present disclosure and includes a drilling or service rig 205, and a plurality of cameras 210. Each of the cameras 210 is a three-dimensional (3D) camera, providing 3D still or video imaging in real time or near real time. In an exemplary embodiment, each of the cameras 210 provides, in real time or near real time, both two dimensional (2D) intensity images and depth information, and converts each 2D point into 3D space by conducting one or more calculations relative to the location of the camera 210. In an exemplary embodiment, each of the cameras 210 provides a 3D focal plane array. In an exemplary embodiment, each of the cameras 210 provides 3D still or moving (or video or movie) imaging in various environments, such as environments including dust, smoke and/or fog. In an exemplary embodiment, each of the cameras 210 provides 3D imaging at frame rates ranging from about 20 Hz to about 200 Hz. In an exemplary embodiment, each of the cameras 210 or associated equipment emits a short laser pulse to determine depth information. In an exemplary embodiment, each of the cameras 210 provides thermal imaging, visual imaging, infrared imaging, or a combination thereof. In an exemplary embodiment, each of the cameras 210 creates a 3D survey of the subject control volume. In an exemplary embodiment, each of the cameras 210 provides 3D mapping over a range of degrees such as, for example, a range of 120 degrees. In several exemplary embodiments, one or more of the cameras 210 are 3D Flash Light Detection and Ranging (LIDAR) cameras, which are available from Advanced Scientific Concepts, Inc., Santa Barbara, Calif. In several exemplary embodiments, one or more of the foregoing embodiments of the cameras 210 are combined in whole or in part with one or more other of the foregoing embodiments of the camera 210.

With continuing reference to FIG. 2, automation of the apparatus 200 is improved significantly using the cameras 210 to view the location of equipment, critical areas of equipment, and relative locations of tubulars 212 and other moveable items in a control volume of three-dimensional space of interest (or a three-dimensional area of interest). For example, to set the top of a tool joint 214 at 3 feet off floor 224, one of the cameras 210 senses the location of pipe 216 in hole 218, and the software operating the camera 210 identifies the tool joint 214 and the top edge and hence communicates to draw-works 220 and slips 222 how to act to set the pipe 216 at 3 feet off the floor 224.

The sensing of depth by the cameras 210 allows the apparatus 200 to automatically operate regardless of lighting changes, air/environment changes and variable pieces of equipment that come in and out of view of the cameras 210. With the cameras 210 and their 3D capability, and thus information regarding the use of physical dimensions of equipment and other pieces, control systems monitor this information to automate one or more operational functions of the apparatus 200, including automating the tubular handling and running activities on the drilling or service rig 205.

Within the apparatus 200, control volumes of different three-dimensional spaces are set up and identified where equipment can or should be present, and equipment is controlled (e.g., moved) to interact with the equipment being sensed by the cameras 210 assigned to respective ones of the control volumes.

Employing one or more of the cameras 210 to obtain three-dimensional viewing of one or more control volumes of three-dimensional spaces, examples of activities that can be automated include: unlatching drillpipe or a tubular 212 at racking board 226, including handling such as grab and pull back; tailing and positioning a tubular 212 on the rig floor 224; setting a tubular 212 at a set height in a hole; bringing an iron roughneck 228 to well center or mouse hole and automatically setting height to make or break connections between tubulars 212; positioning a mud bucket at a tool joint and automatically adjusting height to tool joint; creating tubular handling sequences of events/processes that work by themselves reliably and with minimal or no human intervention until needed; sensing tubular makeup or breakout; and stopping operations safely because a human or an unknown object strays into a control volume that renders the control volume or planned (or ongoing) operation unsafe.

In an exemplary embodiment, the apparatus 200 includes programmable logic controller(s), as well as the cameras 210 with their three-dimensional sensor and software technology, and thus provides the ability to confidently automate one or more sequences (or a portion thereof) where humans have typically been needed to confirm that it is safe to proceed, such as, for example, to ensure a top drive 230 avoids running into pipe because the racking device did not have the pipe out of the way.

In an exemplary embodiment, several of the cameras 210 are needed to cover a particular control volume and paint a clear three dimensional picture of the scene for the equipment controllers to interact with. The ability of equipment to see and be seen in the digital control world such that everything can come closer but never touch, or actually contact in a desired manner rather than an uncontrolled manner, is invaluable to providing autonomous automatic operations, particularly in a wellsite environment.

In several exemplary embodiments, other operational uses on the drilling or service rig 205 include counting and sizing pipes or tubulars 212 on a pipe rack 232. The three-dimensional sensing of the cameras 210 allows the apparatus 200 or portions thereof to find or pick an area in three-dimensional space (i.e., the pipe rack area), and look for items with criteria within the three-dimensional space (e.g., pipe joints that are roughly 30 feet long and six inches wide and rounded).

In several exemplary embodiments, the apparatus 200 or portions thereof monitor the levels of fluids in one or more active mud tanks and calculate a total volume per tank and/or for all mud tanks, and do this on a second-by-second basis or other desired frequency. This allows for increasingly accurate measurement of mud in versus mud out of hole.

In several exemplary embodiments, the apparatus 200 or portions thereof conduct automatic calibration of the hoisting system of a drilling rig, with the cameras 210 telling the control system where the hoisting system is located constantly or at a sufficient frequency (e.g., once every second or tenth of a second) and the hoisting system, which includes a control system, confirming the information supplied by the cameras 210. If there is an inconsistency, the operation of the hoisting system may be stopped. In several exemplary embodiments, the apparatus 200 or portions thereof conduct automatic calibration of other equipment such as, for example, a top drive system (TDS) including the top drive 230, a casing running tool (CRT), a pipe racker 234, the iron roughneck 228, etc., and any combination thereof.

In several exemplary embodiments, the resolution of the 3D pictures provided by one or more of the cameras 210, as well as the frequency of updates, are sufficient to implement automatic operation of equipment, such as the apparatus 100, systems, methods, processes, and/or any combination thereof.

In an exemplary embodiment, the apparatus 200 or at least a portion thereof includes the apparatus 100, and the above-described operation of the apparatus 100 is fully automatic, with the cameras 210 providing real time or near real time 3D imaging of the various components of the apparatus 100.

Figure 3:
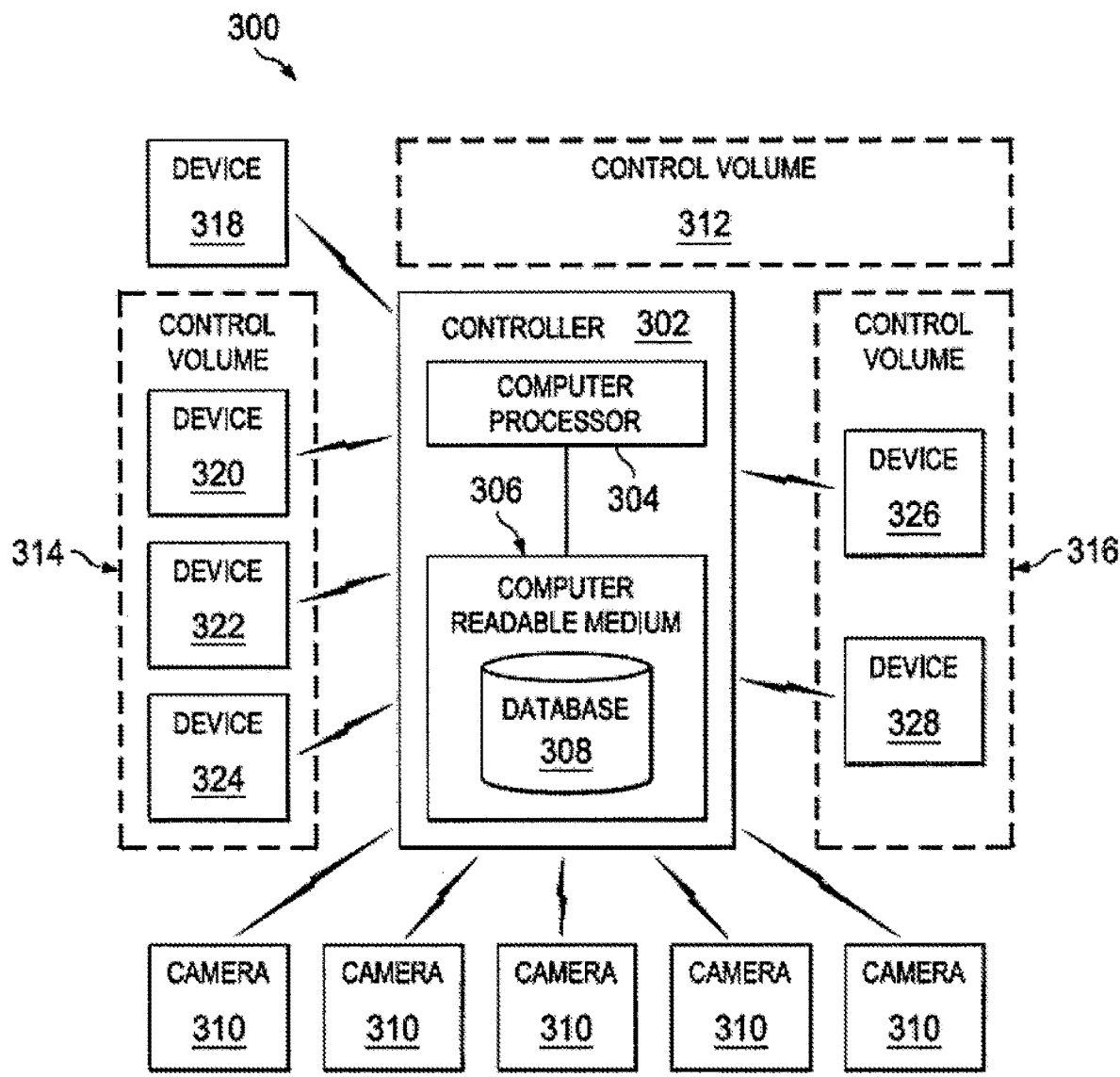
FIG. 3 is a schematic view of apparatus according to one or more aspects of the present disclosure.

Referring to FIG. 3, an apparatus is generally referred to by the reference numeral 300 and includes a controller 302, which includes a computer processor 304 and a computer readable medium 306 operably coupled thereto. Instructions accessible to, and executable by, the computer processor 304 are stored on the computer readable medium 306. The computer readable medium 306 includes a database 308. A plurality of cameras 310 are operably coupled to, and in communication with, the controller 302. The cameras 310 are substantially identical to the cameras 210 and therefore will not be described in further detail. Respective combinations of the cameras 310 are positioned in respective ones of a plurality of control volumes of three-dimensional spaces 312, 314, 316. A device 318 is expected to be moved into the control volume 312. Devices 320, 322 and 324 are positioned in the control volume 314. Devices 326 and 328 are positioned in the control volume 316. The controller 302 is operably coupled to, and in communication with, each of the devices 318, 320, 322, 324, 326 and 328.

In an exemplary embodiment, during operation, the cameras 310 provide real time or near real time 3D imaging of three-dimensional spaces contained in the control volumes 312, 314 and 316, and thus provide real time or near real time 3D imaging of the interaction between the control volumes 312, 314 and 316 and the devices 318, 320, 322, 324, 326 and 328. The 3D imaging information is transmitted from the cameras 310 to the controller 302. Based on at least the 3D imaging transmitted from the cameras 310, the controller 302 controls one or more of the devices 318, 320, 322, 324, 326 and 328 or portions thereof by, for example, identifying, counting, controlling the operation of, controlling the position and/or movement of, and/or determining the sizes of, the one or more devices 318, 320, 322, 324, 326 and 328 or portions thereof. In several exemplary embodiments, one or more of the control volumes 312, 314 and 316 are at a wellsite, and one or more of the devices 318, 320, 322, 324, 326 and 328 are employed in mineral exploration and production activities, such as oil and gas exploration and production activities.

In several exemplary embodiments, the operation of the apparatus 300 is substantially identical to the operation of the apparatus 200.

In an exemplary embodiment, one or more of the cameras 210 or 310 are permanently fixed within the apparatus 100, 200 or 300, respectively. In an exemplary embodiment, one or more of the cameras 210 or 310 are movable within the apparatus 100, 200 or 300, respectively.

In an exemplary embodiment, the apparatus 100, 200 or 300 operates to determine a length dimension of a tubular. In an exemplary embodiment, two cameras 210 or 310 are employed to provide 3D imaging of a device such as, for example, the device 318, 320, 322, 324, 326 or 328.

In an exemplary embodiment, the output of the cameras 210 or 310 controls one or more tools such as, for example, an iron roughneck, a pipe handler, a casing running tool, a top drive system, a hoisting system, a mud tank farm, and/or any combination thereof.

In an exemplary embodiment, the apparatus 100, 200 or 300 is employed to identify, count, control the operation of, control the position and/or movement of, and/or determine the size of, equipment at a wellsite.

In an exemplary embodiment, the apparatus 100, 200 or 300 is employed to identify, count, control the operation of, control the position and/or movement of, and/or determine the size of, equipment at a rigsite.

In an exemplary embodiment, the apparatus 100, 200 or 300 is employed to manage drums or bags, or both, employed in connection with drilling mud or fluid.

In an exemplary embodiment, the cameras 210 or 310 are layered linearly, radially, circumferentially and/or any combination thereof, in order to sufficiently provide 3D imaging of equipment at a wellsite. In an exemplary embodiment, three cameras 210 or 310 are provided, with each camera 210 or 310 providing 3D imaging across a 120-degree sweep, in order to sufficiently provide 360-degree 3D imaging of a piece of equipment, such as a tubular.

In an exemplary embodiment, the apparatus 100, 200 or 300, or the cameras 210 or 310, are employed at an underwater wellsite in order to, for example, inspect subsea connections, subsea blowout prevention (BOP) stacks, offshore drilling activities, or offshore drilling production activities.

In an exemplary embodiment, the apparatus 100, 200 or 300, or the cameras 210 or 310, are employed in determining the structural integrity of one or more components or equipment at a wellsite. For example, the apparatus 100, 200 or 300, or the cameras 210 or 310, are employed to determine the structural integrity of risers.

In an exemplary embodiment, the apparatus 100, 200 or 300, or the cameras 210 or 310, are employed in counting the number of tubulars that are on a rack.

In an exemplary embodiment, the apparatus 100, 200 or 300, or the cameras 210 or 310, are employed in finding a target on a piece of equipment, such as a tubular, thereby identifying the piece of equipment, the position of the equipment, or both. In an exemplary embodiment, the apparatus 100, 200 or 300 operates as a camera-driven encoder system.

In an exemplary embodiment, the apparatus 100, 200 or 300, or the cameras 210 or 310, are time synced to logs coming out of a well at a wellsite.

In an exemplary embodiment, the apparatus 100, 200 or 300, or the cameras 210 or 310, operate as a digital video recording, recording activities at a wellsite for future reference; thus, the apparatus 100, 200 or 300, or the cameras 210 or 310, serve as a "black box" for the wellsite, providing a historical record of activities at the wellsite. In an exemplary embodiment, historical records are stored in the database 308.

In an exemplary embodiment, one or more of the cameras 210 or 310 are mounted on, or are part of, a downhole tool that is lowered by a wireline into a wellbore. While moving, or being positioned within, the wellbore, the cameras 210 or 310 survey or inspect the wellbore, and/or any casing within the wellbore. In an exemplary embodiment, the cameras 210 or 310 are employed to inspect such casing after hydraulic fracturing activities.

In an exemplary embodiment, one or more of the cameras 210 or 310 are mounted on, or are part of, a downhole tool that is lowered by a wireline into a wellbore. While moving, or being positioned within, the wellbore, the cameras 210 or 310 look for casing problems, tubular breakoffs, or unwanted material ("junk") in the wellbore.

Figure 4:
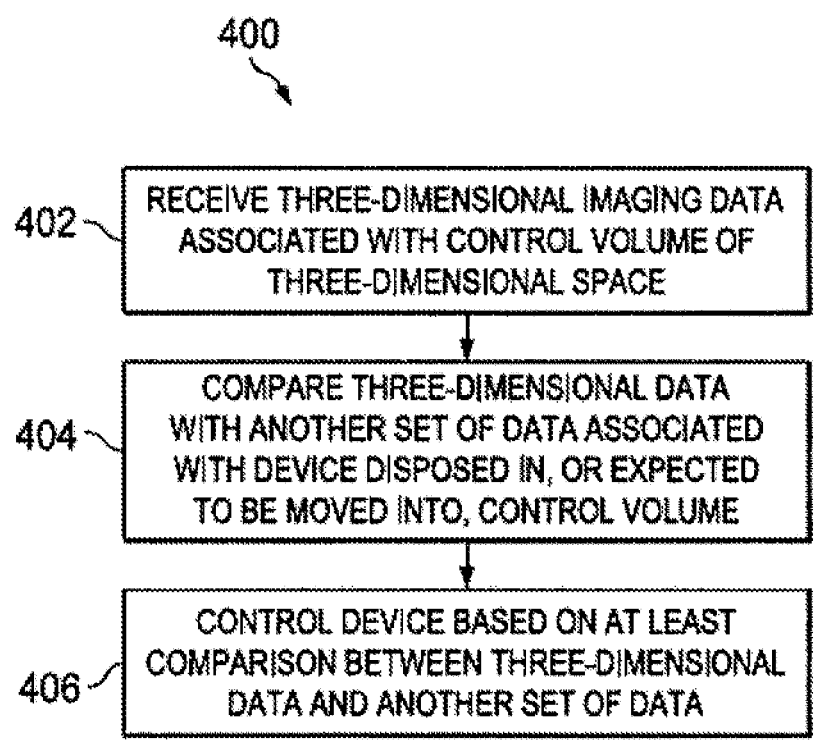
FIG. 4 is a flow-chart diagram of at least a portion of a method according to one or more aspects of the present disclosure.

Referring to FIG. 4, at least a portion of a method according to one or more aspects of the present disclosure is generally referred to by the reference numeral 400 and includes at step 402 receiving three-dimensional imaging data associated with a control volume of three-dimensional space; at step 404 comparing the three-dimensional data with another set of data associated with a device disposed in, or expected to be moved into, the control volume; and at step 406 controlling the device based on at least the comparison between the three-dimensional data and the another set of data.

Figure 5:
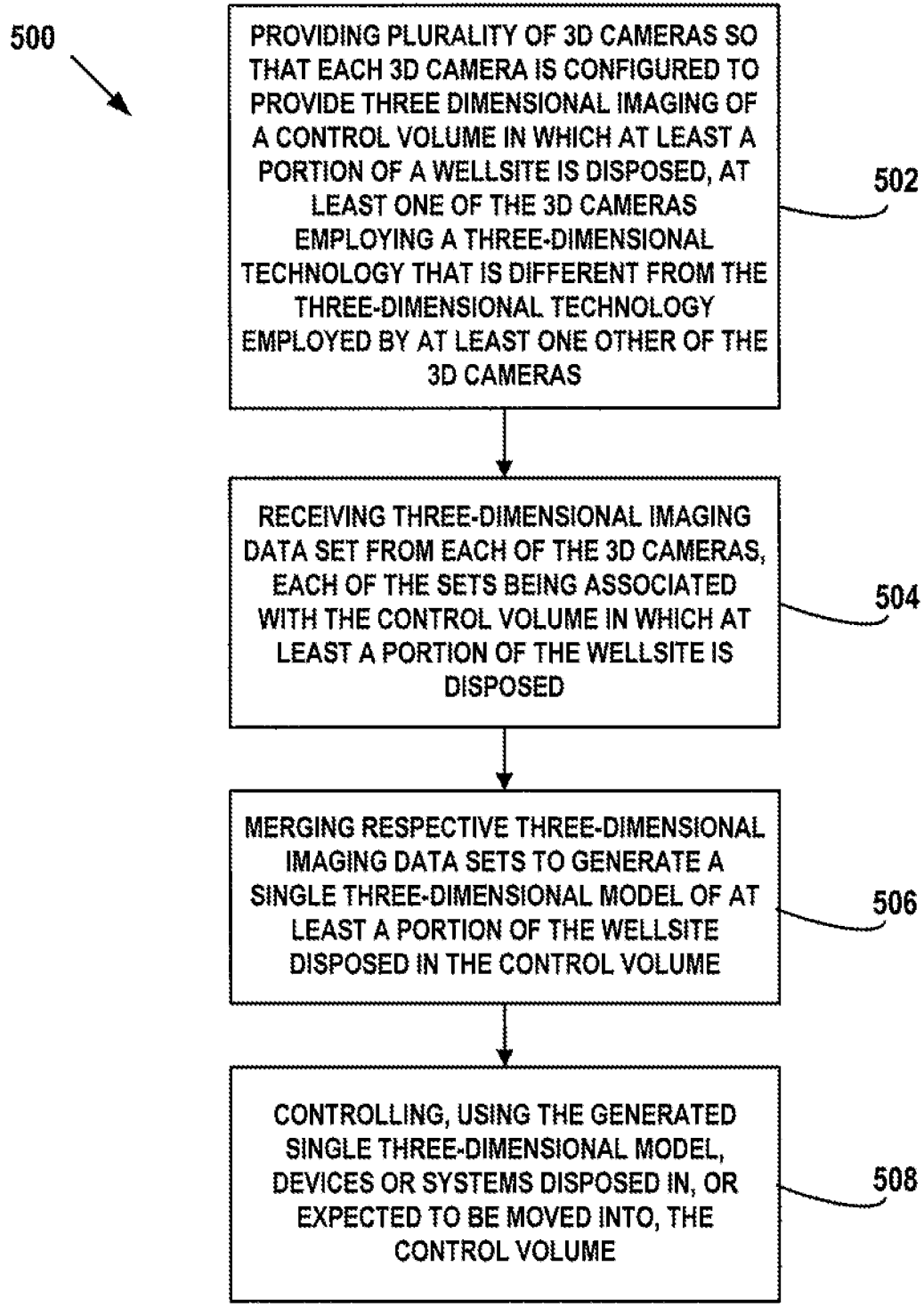
FIG. 5 is a flow-chart diagram of at least a portion of a method according to one or more aspects of the present disclosure.

Referring to FIG. 5, at least a portion of a method according to one or more aspects of the present disclosure is generally referred to by the reference numeral 500 and includes at step 502 providing a plurality of 3D cameras so that each of the 3D cameras is configured to provide three-dimensional imaging of a control volume of three-dimensional space. At the step 502, at least a portion of a wellsite is disposed in the control volume, and at least one of the 3D cameras employs a 3D technology that is different from the 3D technology employed by at least one other of the 3D cameras. In an exemplary embodiment, one or more of the 3D cameras provided at the step 502 include one or more of the cameras 210, one or more of the cameras 310, or any combination thereof. In several exemplary embodiments, at least a portion of the apparatus 100, 200 or 300 is disposed in the control volume. In an exemplary embodiment, the portion of the wellsite includes at least a portion of a drilling rig (e.g., the drilling rig of the apparatus 100 or the drilling or service rig 205), at least a portion of a wellbore such as the wellbore 160, or any combination thereof. In several exemplary embodiments, at least one of the 3D cameras provided at the step 502 employs stereo vision technology, and at least one other of the 3D cameras provided at the step 502 employs time-of-flight technology. In several exemplary embodiments, at least one of the 3D cameras provided at the step 502 employs range finding technology, and at least one other of the 3D cameras provided at the step 502 employs either stereo vision technology or time-of-flight technology. In several exemplary embodiments, each of the 3D technologies employed by the plurality of 3D cameras provided at the step 502 has advantages and disadvantages under different light conditions, different dust conditions, different rain conditions, etc.

At step 504 of the method 500, a three-dimensional imaging data set is received from each of the plurality of 3D cameras provided at the step 502, each of the three-dimensional imaging data sets being associated with the control volume in which at least a portion of the wellsite is disposed.

At step 506 of the method 500, the respective three-dimensional imaging data sets received from the plurality of 3D cameras are merged to generate a single three-dimensional model of at least a portion of the wellsite disposed in the control volume. In an exemplary embodiment, the three-dimensional imaging data sets are merged by marrying, or otherwise merging, the signals provided by the different technologies respectively employed by the 3D cameras provided at the step 502.

In several exemplary embodiments, the method 500 further includes at step 508 controlling, using the single three-dimensional model generated at the step 506, devices or systems disposed in, or expected to be moved into (or out of), the control volume of which the plurality of 3D cameras provided at the step 502 are configured to provide three-dimensional imaging. Such devices or systems may include, for example, the top drive 140, the top drive 230, the pipe racker 234, the iron roughneck 228, the tubular lifting device 152, the draw-works 130, the draw-works 220, the slips 222, the tubulars 212, or any combination thereof.

In several exemplary embodiments, using multiple 3D technologies in the method 500 increases the reliability of the solution, and even assures a reliable solution (i.e., reliable three-dimensional imaging) under all conditions, because each 3D technology has advantages and disadvantages under different light conditions, different dust conditions, different rain conditions, etc.

Figure 6:
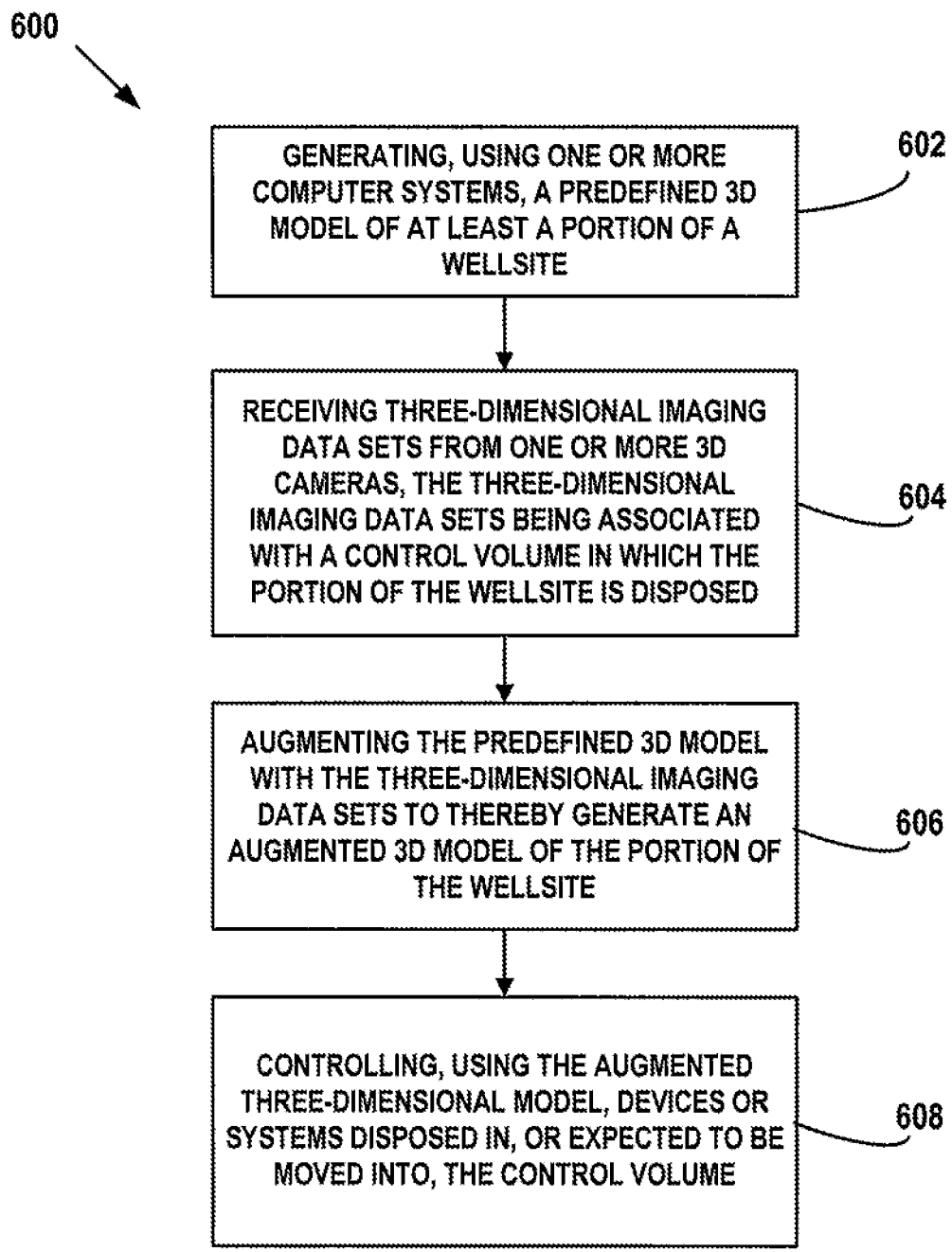
FIG. 6 is a flow-chart diagram of at least a portion of a method according to one or more aspects of the present disclosure.

Referring to FIG. 6, at least a portion of a method according to one or more aspects of the present disclosure is generally referred to by the reference numeral 600 and includes at step 602 generating, using one or more nodes or computer systems, a predefined 3D model of at least a portion of a wellsite, such as a portion of the apparatus 100 or 200.

At step 604, three-dimensional imaging data sets from one or more 3D cameras are received, the three-dimensional imaging data sets being associated with a control volume in which the portion of the wellsite, of which the predefined 3D model was generated at the step 602, is disposed. In an exemplary embodiment, one or more of the 3D cameras from which the data sets are received at the step 602 include one or more of the cameras 210, one or more of the cameras 310, or any combination thereof.

At step 606, the predefined 3D model generated at the step 602 is augmented with the three-dimensional data sets received at the step 604 to thereby generate an augmented 3D model of the portion of the wellsite.

In several exemplary embodiments, the method 600 further includes at step 608 controlling, using the augmented 3D model generated at the step 606, devices or systems disposed in, or expected to be moved into, the control volume in which the portion of the wellsite is disposed. Such devices or systems may include, for example, the top drive 140, the top drive 230, the pipe racker 234, the iron roughneck 228, the tubular lifting device 152, the draw-works 130, the draw-works 220, the slips 222, the tubulars 212, or any combination thereof.

In several exemplary embodiments, using three-dimensional sensing alone to monitor and/or control one or more operations at the wellsite may possibly introduce some errors, particularly if objects are moving fast (e.g., faster than average or faster than one or more other slower moving objects, each for an object at the wellsite or in the control volume), or if respective distances from the camera/sensors increase. However, in accordance with the method 600, computations from the 3D cameras employed in the method 600 can be used to place the moving objects in the pre-defined 3D model generated at the step 602 to compute more accurate positions of the moving objects. In several exemplary embodiments, the predefined 3D model generated at the step 602, and/or the augmented 3D model generated at the step 604, may provide information as to constraints about which the moving objects can move to limit errors; for example, providing constraints regarding which axes, about which moving objects can move, may be used to more accurately place the moving objects in the 3D model. Examples of such moving objects may include link tilts associated with the apparatus 100 or 200.

Figure 7:
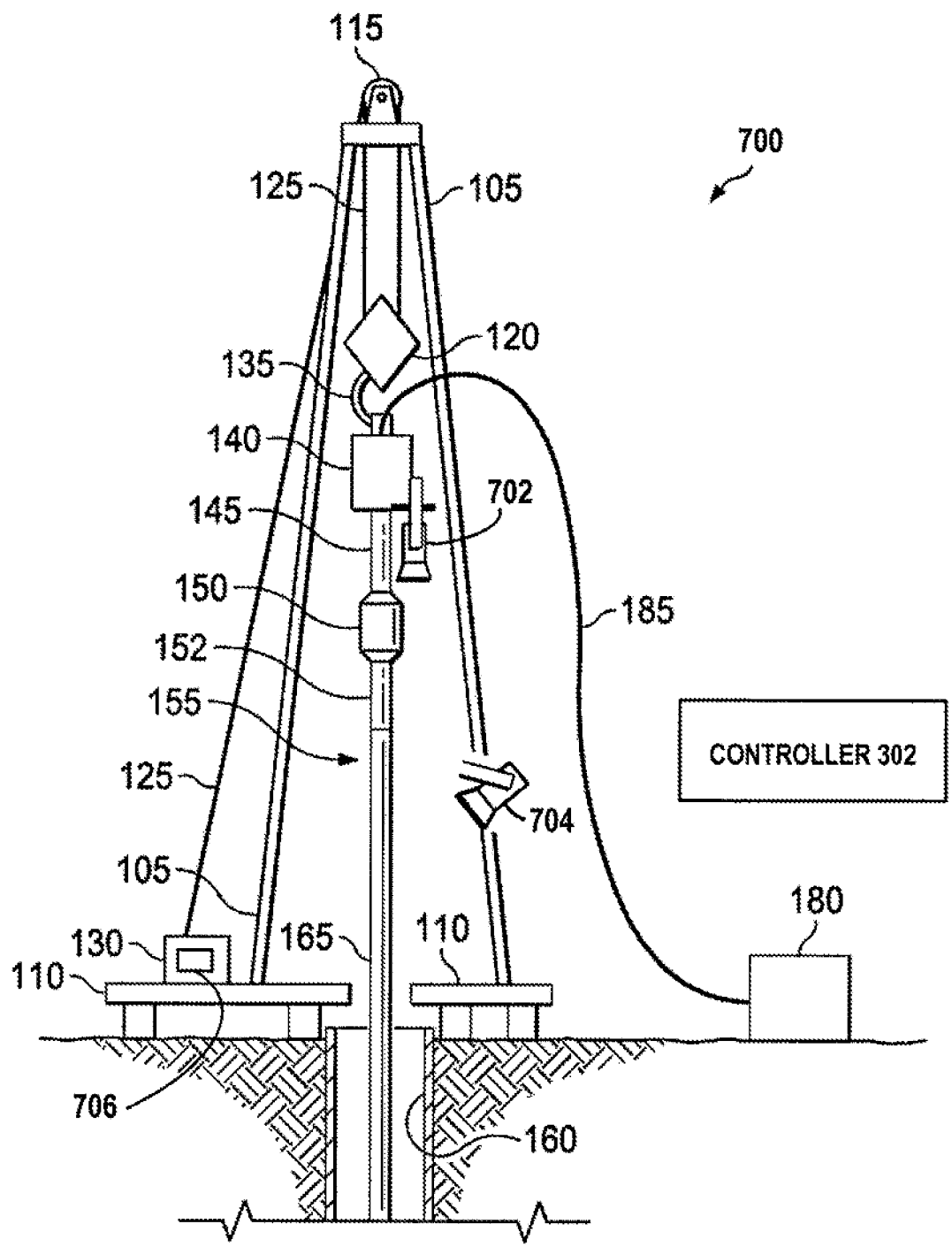
FIG. 7 is a schematic view of apparatus according to one or more aspects of the present disclosure.

Referring to FIG. 7, illustrated is a schematic view of apparatus 700, which is within the scope of the present disclosure and includes all of the components of the apparatus 100, which components are given the same reference numerals. Additionally, the apparatus 700 includes the controller 302, and 3D sensors or cameras 702 and 704. The 3D camera 702 is connected to the top drive 140, and the 3D camera 704 is connected to the mast 105. In several exemplary embodiments, each of the 3D cameras 702 and 704 includes one or more of the cameras 210, one or more of the cameras 310, or any combination thereof. The apparatus 700 further includes an encoder 706, which is part of, or operably coupled to, the draw-works 130. The encoder 706 is adapted to be used to determine the position of the traveling block 120, facilitating in the accurate prediction of drilling depth in the wellbore 160. The controller 302 is in communication with each of the encoder 706 and the 3D cameras 702 and 704.

In operation, in an exemplary embodiment, the position of the traveling block 120 is determined using the encoder 706. As the traveling block 120 moves, the encoder 706 registers, counts, and transmits count data to the controller 302. The motion per encoder count is calculated by the controller 302 using a calibration process and a known absolute block position of the traveling block 120. The calculation of the motion per encoder count determines the position of the traveling block 120. During the movement of the traveling block 120, the 3D cameras 702 and 704 keep track of the position of the traveling block 120, transmitting three-dimensional imaging data to the controller 302, which confirms the determinations made using the encoder 706. Similar motion per encoder counts can be pre-set or calculated for various other objects in the wellsite, including without limitation the top drive vertical motion and rotation, link tilt extension and position, tubular position within the wellsite and rotation about a vertical axis, etc.

Figure 8:
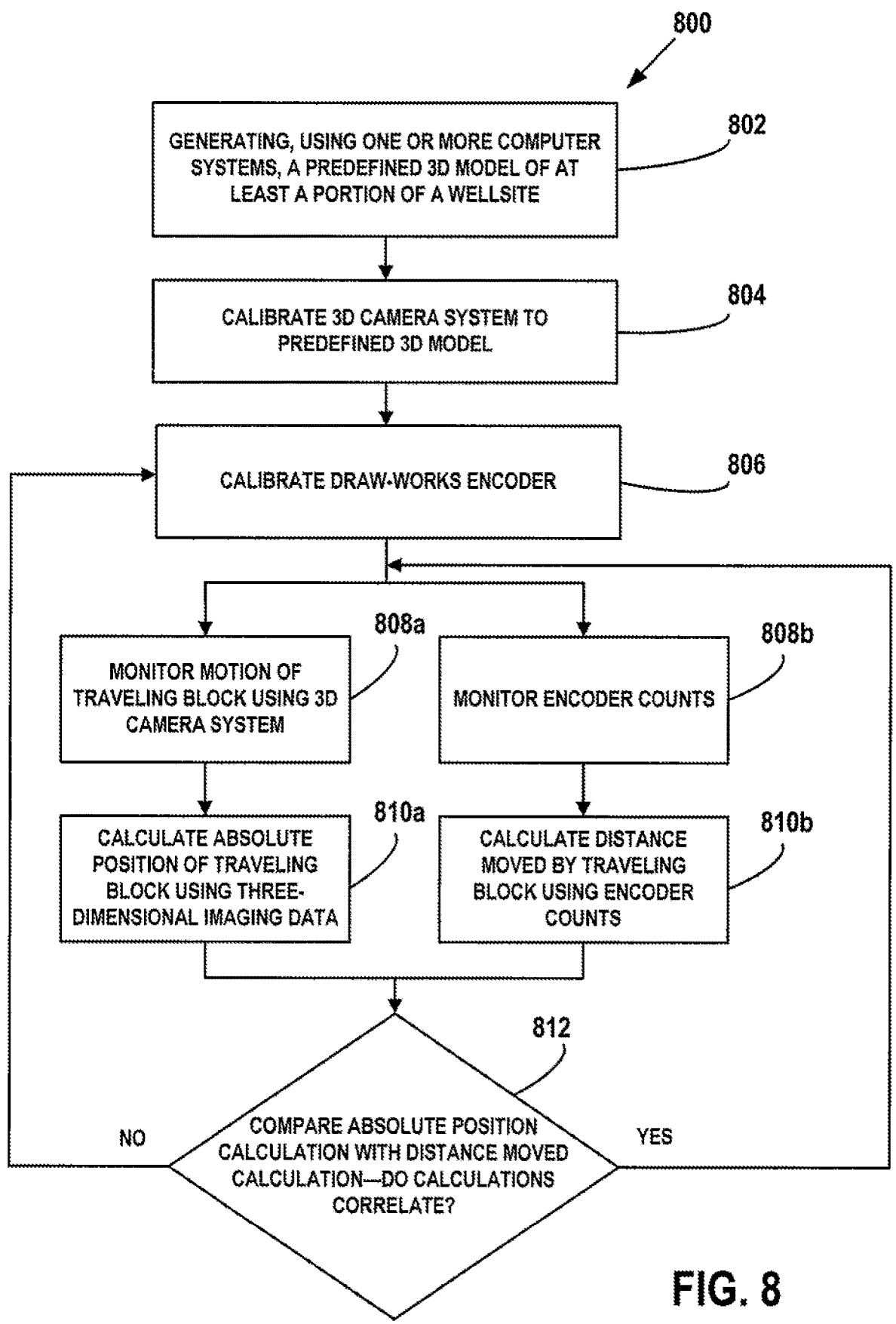
FIG. 8 is a flow-chart diagram of at least a portion of a method according to one or more aspects of the present disclosure.

Referring to FIG. 8, at least a portion of a method according to one or more aspects of the present disclosure is generally referred to by the reference numeral 800. In an exemplary embodiment, the method 800 is a method of calibrating the encoder 706 and includes at step 802 generating, using one or more computer systems, a predefined 3D model of at least a portion of the apparatus 700. Before, during or after the step 802, at step 804 a 3D camera system, including the 3D cameras 702 and 704, is calibrated to the 3D model generated at the step 802. Before, during or after the step 804, the encoder 706 of the draw-works 130 is calibrated at step 806. At step 808*a*, the motion of the traveling block 120, during the operation of the apparatus 700, is monitoring using the 3D camera system, including the 3D cameras 702 and 704. During the step 808*a*, the counts of the encoder 706 of the draw-works 130 are monitored at step 808*b* using, for example, the controller 302 and/or the encoder 706. During the steps 808*a* and 808*b*, the absolute position of the traveling block 120 is calculated at step 810*a* using the three-dimensional imaging data provided by the 3D cameras 702 and 704 at the step 808*a*. During the step 810*a*, the distance that the traveling block 120 has moved is calculated at step 810*b* using the encoder counts monitored at the step 810*a*. In an exemplary embodiment, the step 810*a* includes augmenting the 3D model generated at the step 802 to thereby generate an augmented 3D model. In an exemplary embodiment, the steps 810*a* and 810*b* are executed using the controller 302. The steps 808*a*, 808*b*, 810*a* and 810*b* are repeated throughout, or at least through a portion of, the operation of the apparatus 700, including the raising and/or lowering of the traveling block 120. During the steps 808*a*, 808*b*, 810*a* and 810*b*, at step 812 the absolute position calculated at the step 810*a* is compared with the distance calculated at the step 810*b* to determine if the calculations correlate. If not, the step 806 is repeated, that is, the encoder 706 is automatically recalibrated, after which the steps 808*a*, 808*b*, 810*a*, 810*b* and 812 are repeated. After it is determined at the step 812 that the calculations do indeed correlate, the steps 808*a*, 808*b*, 810*a*, 810*b* and 812 are repeated throughout, or at least through a portion of, the operation of the apparatus 700, including the raising and/or lowering of the traveling block 120. In several exemplary embodiments, the step 812 may be executed at all times, or periodically, during the execution of the steps 808*a*, 808*b*, 810*a* and 810*b*.

In several exemplary embodiments, as a result of the execution of the method 800 during the operation of the apparatus 700, the 3D camera system used in the method 800, including the 3D cameras 702 and 704, independently tracks the position of the traveling block 120 and this position is correlated with the position calculated from the encoder 706; if the positions do not correlate, correction are made to the encoder 706, that is, the encoder 706 is automatically recalibrated.

In an exemplary embodiment, during the operation of the apparatus 700 and the simultaneous execution of the method 800, the encoder 706 may not register a count. In an exemplary embodiment, the encoder 706 may not register a count because the traveling block 120 is moving very quickly during a particular trip, that is, during a particular act of pulling the drill pipe 165 out of the wellbore 160, or a particular act of replacing the drill pipe 165 in the wellbore 160. The use of 3D sensing technology in the method 800 keeps track of the position of the traveling block 120 in real time or near real time to thereby determine whether the encoder 706 has not registered one or more counts. As a result of the execution of the method 800 during the operation of the apparatus 700, the event of losing count(s) is detected and the calibration of the encoder 706 is automatically corrected to keep a more accurate position of the traveling block 120.

In an exemplary embodiment, the 3D camera 704 is omitted from the 3D camera system used in the method 800. In an exemplary embodiment, the 3D camera 704 is omitted from the 3D camera system used in the method 800, and the 3D camera system is a range finding system including the 3D camera 702. In an exemplary embodiment, instead of the top drive 140, the 3D camera 702 is connected to the traveling block 120, or to another component that moves along with the traveling block 120. In an exemplary embodiment, instead of the mast 105, the camera 704 is connected to the rig floor 110, or to another component that remains stationary while the traveling block 120 moves up or down. In an exemplary embodiment, the 3D camera system used in the method 800, including the 3D cameras 702 and 704, can be a full 3D model camera system. In one embodiment (not shown), two or more components are moving simultaneously.

Figure 9:
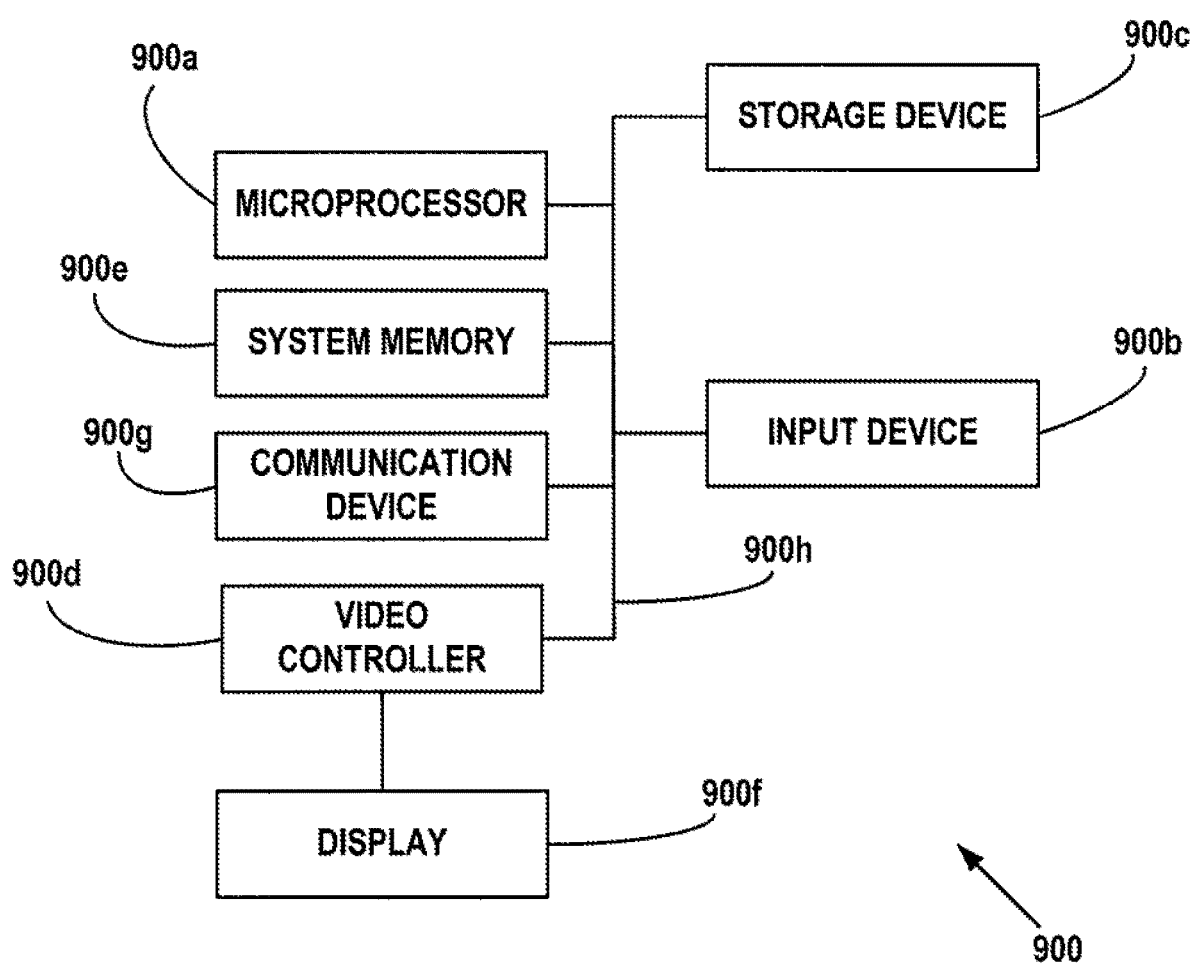
FIG. 9 is a schematic view of a node for implementing one or more aspects of the present disclosure.

Referring to FIG. 9, an exemplary node 900 for implementing one or more embodiments of one or more of the above-described apparatus, elements, methods and/or steps, and/or any combination thereof, is depicted. The node 900 includes a microprocessor 900*a*, an input device 900*b*, a storage device 900*c*, a video controller 900*d*, a system memory 900*e*, a display 900*f*, and a communication device 900*g*, all of which are interconnected by one or more buses 900*h*. In several exemplary embodiments, the storage device 900*c* may include a floppy drive, hard drive, CD-ROM, optical drive, any other form of storage device and/or any combination thereof. In several exemplary embodiments, the storage device 900*c* may include, and/or be capable of receiving, a floppy disk, CD-ROM, DVD-ROM, or any other form of computer-readable medium that may contain executable instructions. In several exemplary embodiments, the communication device 900*g* may include a modem, network card, or any other device to enable the node to communicate with other nodes. In several exemplary embodiments, any node represents a plurality of interconnected (whether by intranet or Internet) computer systems, including without limitation, personal computers, mainframes, PDAs, smartphones and cell phones.

In several exemplary embodiments, one or more of the components of the apparatus 100, 200 or 300 include at least the node 900 and/or components thereof, and/or one or more nodes that are substantially similar to the node 900 and/or components thereof. In several exemplary embodiments, one or more of the above-described components of the node 900 and/or the apparatus 100, 200 or 300 include respective pluralities of same components.

In several exemplary embodiments, a computer system typically includes at least hardware capable of executing machine readable instructions, as well as the software for executing acts (typically machine-readable instructions) that produce a desired result. In several exemplary embodiments, a computer system may include hybrids of hardware and software, as well as computer sub-systems.

In several exemplary embodiments, hardware generally includes at least processor-capable platforms, such as client-machines (also known as personal computers or servers), and hand-held processing devices (such as smart phones, tablet computers, personal digital assistants (PDAs), or personal computing devices (PCDs), for example). In several exemplary embodiments, hardware may include any physical device that is capable of storing machine-readable instructions, such as memory or other data storage devices. In several exemplary embodiments, other forms of hardware include hardware sub-systems, including transfer devices such as modems, modem cards, ports, and port cards, for example.

In several exemplary embodiments, software includes any machine code stored in any memory medium, such as RAM or ROM, and machine code stored on other devices (such as floppy disks, flash memory, or a CD ROM, for example). In several exemplary embodiments, software may include source or object code. In several exemplary embodiments, software encompasses any set of instructions capable of being executed on a node such as, for example, on a client machine or server.

In several exemplary embodiments, combinations of software and hardware could also be used for providing enhanced functionality and performance for certain embodiments of the present disclosure. In an exemplary embodiment, software functions may be directly manufactured into a silicon chip. Accordingly, it should be understood that combinations of hardware and software are also included within the definition of a computer system and are thus envisioned by the present disclosure as possible equivalent structures and equivalent methods.

In several exemplary embodiments, computer readable mediums include, for example, passive data storage, such as a random access memory (RAM) as well as semi-permanent data storage such as a compact disk read only memory (CD-ROM). One or more exemplary embodiments of the present disclosure may be embodied in the RAM of a computer to transform a standard computer into a new specific computing machine. In several exemplary embodiments, data structures are defined organizations of data that may enable an embodiment of the present disclosure. In an exemplary embodiment, a data structure may provide an organization of data, or an organization of executable code.

In several exemplary embodiments, any networks and/or one or more portions thereof may be designed to work on any specific architecture. In an exemplary embodiment, one or more portions of any networks may be executed on a single computer, local area networks, client-server networks, wide area networks, internets, hand-held and other portable and wireless devices and networks.

In several exemplary embodiments, a database may be any standard or proprietary database software, such as Oracle, Microsoft Access, SyBase, or DBase II, for example. In several exemplary embodiments, the database may have fields, records, data, and other database elements that may be associated through database specific software. In several exemplary embodiments, data may be mapped. In several exemplary embodiments, mapping is the process of associating one data entry with another data entry. In an exemplary embodiment, the data contained in the location of a character file can be mapped to a field in a second table. In several exemplary embodiments, the physical location of the database is not limiting, and the database may be distributed. In an exemplary embodiment, the database may exist remotely from the server, and run on a separate platform. In an exemplary embodiment, the database may be accessible across the Internet. In several exemplary embodiments, more than one database may be implemented.

In several exemplary embodiments, a plurality of instructions stored on a computer readable medium may be executed by one or more processors to cause the one or more processors to carry out or implement in whole or in part the above-described operation of each of the above-described exemplary embodiments of the apparatus 100, 200 or 300, the method 400, and/or any combination thereof. In several exemplary embodiments, such a processor may include one or more of the microprocessor 900a, any processor(s) that are part of the components of the apparatus 100, 200 or 300, and/or any combination thereof, and such a computer readable medium may be distributed among one or more components of the apparatus 100, 200 or 300. In several exemplary embodiments, such a processor may execute the plurality of instructions in connection with a virtual computer system. In several exemplary embodiments, such a plurality of instructions may communicate directly with the one or more processors, and/or may interact with one or more operating systems, middleware, firmware, other applications, and/or any combination thereof, to cause the one or more processors to execute the instructions.

In view of all of the above and the figures, one of ordinary skill in the art will readily recognize that the present disclosure introduces an apparatus including at least one camera configured to provide three-dimensional imaging of a control volume of three-dimensional space; at least a portion of a wellsite disposed in the control volume; and at least one device disposed in, or expected to be moved into, the control volume so that the at least one device is included in the three-dimensional imaging when the at least one device is disposed in the control volume and the at least one camera provides the three-dimensional imaging. According to one aspect, the at least a portion of the wellsite includes at least a portion of a drilling rig. According to another aspect, the at least a portion of the wellsite includes at least a portion of a wellbore. According to yet another aspect, the apparatus includes a drilling rig; wherein the at least a portion of the wellsite is at least a portion of the drilling rig; and wherein the at least one camera is connected to the drilling rig. According to still yet another aspect, the at least one device includes one or more of the following: a mast; a crown block; a traveling block; a drilling line; draw-works; a hook; a top drive; a quill; a tubular lifting device; a drill string; and a pump. According to still yet another aspect, the apparatus includes a controller; and a second device disposed in the control volume; wherein the at least one device is movable in relation to the second device and the at least one camera provides relative spatial relationship information for the devices to the controller; and wherein the controller controls the second device based on the relative spatial relationship information. According to still yet another aspect, the at least one device includes a tubular; wherein the second device includes at least one of a top drive, a pipe racker, and a tubular lifting device; and wherein the controller controls the at least one of the top drive, the piper racker, and the tubular lifting device based on the relative spatial relationship information for the tubular and the at least one of the top drive, the pipe racker, and the tubular lifting device. According to still yet another aspect, the at least a portion of the wellsite includes at least a portion of a wellbore; wherein the apparatus further includes a downhole tool adapted to be lowered into the wellbore; wherein the at least one camera is connected to the downhole tool; wherein the at least one device includes casing within the wellbore; and wherein the at least one camera provides the three-dimension imaging to inspect the casing when the downhole tool is lowered into the wellbore. According to still yet another aspect, the apparatus includes at least one other camera configured to provide three-dimensional imaging of another control volume of three-dimensional space; wherein another portion of the wellsite is disposed in the another control volume.

The present disclosure also introduces a method including receiving three-dimensional imaging data associated with a control volume of three-dimensional space, wherein at least a portion of a wellsite is disposed in the control volume; comparing the three-dimensional data with another set of data associated with a device disposed in, or expected to be moved into, the control volume; and controlling the device based on at least the comparison between the three-dimensional data and the another set of data. According to one aspect, the at least a portion of the wellsite includes at least a portion of a drilling rig. According to another aspect, the at least a portion of the wellsite includes at least a portion of a wellbore. According to yet another aspect, the device is a tubular; and wherein controlling the device based on at least the comparison between the three-dimensional data and the another set of data includes controlling at least one of a top drive, a pipe racker, a tubular lifting device, and draw-works. According to still yet another aspect, the at least a portion of the wellsite includes at least a portion of a wellbore; wherein the device is a downhole tool adapted to be lowered into the wellbore; and wherein the downhole tool is controlled to inspect casing within the wellbore.

The present disclosure also introduces a method including receiving three-dimensional imaging data associated with a control volume of three-dimensional space, wherein at least a portion of a wellsite is disposed in the control volume; calculating one or more dimensions using the three-dimensional imaging data; and at least one of the following: calibrating a first system located at the wellsite using the calculated one or more dimensions; identifying a first component located at the wellsite based on the calculated one or more dimensions; counting a plurality of second components located at the wellsite based on the calculated one or more dimensions; and controlling a second system located at the wellsite using the calculated one or more dimensions. According to one aspect, the method includes calibrating the first system located at the wellsite using the calculated one or more dimensions; wherein the first system located at the wellsite and calibrated using the calculated one or more dimensions includes one or more of the following: a hoisting system of a drilling rig, a top drive system, a casing running tool, a pipe racker, and an iron roughneck. According to another aspect, the method includes identifying the first component located at the wellsite based on the calculated one or more dimensions; wherein the first component located at the wellsite is a tubular on a pipe rack, the tubular having a length; wherein the calculated one or more dimensions include the length of the tubular; and wherein the first component is identified by comparing the length of the tubular with a criteria. According to yet another aspect, the method includes counting the plurality of second components located at the wellsite; wherein the plurality of second components located at the wellsite is a plurality of tubulars on a pipe rack, each of the tubulars having a length; wherein the calculated one or more dimensions include the respective lengths of the tubulars; and wherein counting the plurality of second components includes: identifying each of the tubulars by comparing the length of the tubular with a criteria; and counting the quantity of tubulars that meet the criteria. According to still yet another aspect, the method includes controlling the second system located at the wellsite using the calculated one or more dimensions; wherein the second system located at the wellsite and controlled using the one or more dimensions includes one or more of the following: an iron roughneck, a pipe handler, a casing running tool, a top drive system, a hoisting system, and a mud tank farm. According to still yet another aspect, the second system includes the mud tank farm, the mud tank farm including one or more active mud tanks; and wherein the one or more dimensions include respective fluid levels in the one or more active mud tanks.

The present disclosure also introduces an apparatus including a computer readable medium; and a plurality of instructions stored on the computer readable medium and executable by one or more processors, the plurality of instructions including: instructions that cause the one or more processors to receive three-dimensional imaging data associated with a control volume of three-dimensional space, wherein at least a portion of a wellsite is disposed in the control volume; instructions that cause the one or more processors to compare the three-dimensional data with another set of data associated with a device disposed in, or expected to be moved into, the control volume; and instructions that cause the one or more processors to control the device based on at least the comparison between the three-dimensional data and the another set of data. According to one aspect, the at least a portion of the wellsite includes at least a portion of a drilling rig. According to another aspect, the at least a portion of the wellsite includes at least a portion of a wellbore. According to yet another aspect, the device is a tubular; and wherein instructions that cause the one or more processors to control the device based on at least the comparison between the three-dimensional data and the another set of data include instructions that cause the one or more processors to control at least one of a top drive, a pipe racker, a tubular lifting device, and draw-works. According to still yet another aspect, the at least a portion of the wellsite includes at least a portion of a wellbore; wherein the device is a downhole tool adapted to be lowered into the wellbore; and wherein the downhole tool is controlled to inspect casing within the wellbore.

The present disclosure also introduces an apparatus including a computer readable medium; and a plurality of instructions stored on the computer readable medium and executable by one or more processors, the plurality of instructions including: instructions that cause the one or more processors to receive three-dimensional imaging data associated with a control volume of three-dimensional space, wherein at least a portion of a wellsite is disposed in the control volume; instructions that cause the one or more processors to calculate one or more dimensions using the three-dimensional imaging data; and at least one of the following: instructions that cause the one or more processors to calibrate a first system located at the wellsite using the calculated one or more dimensions; instructions that cause the one or more processors to identify a first component located at the wellsite based on the calculated one or more dimensions; instructions that cause the one or more processors to count a plurality of second components located at the wellsite based on the calculated one or more dimensions; and instructions that cause the one or more processors to control a second system located at the wellsite using the calculated one or more dimensions. According to one aspect, the plurality of instructions includes the instructions that cause the one or more processors to calibrate the first system located at the wellsite using the calculated one or more dimensions; wherein the first system located at the wellsite and calibrated using the calculated one or more dimensions includes one or more of the following: a hoisting system of a drilling rig, a top drive system, a casing running tool, a pipe racker, and an iron roughneck. According to another aspect, the plurality of instructions includes the instructions that cause the one or more processors to identify the first component located at the wellsite based on the calculated one or more dimensions; wherein the first component located at the wellsite is a tubular on a pipe rack, the tubular having a length; wherein the calculated one or more dimensions include the length of the tubular; and wherein the first component is identified by comparing the length of the tubular with a criteria. According to yet another aspect, the plurality of instructions includes the instructions that cause the one or more processors to count the plurality of second components located at the wellsite; wherein the plurality of second components located at the wellsite is a plurality of tubulars on a pipe rack, each of the tubulars having a length; wherein the calculated one or more dimensions include the respective lengths of the tubulars; and wherein the instructions that cause the one or more processors to count the plurality of second components include: instructions that cause the one or more processors to identify each of the tubulars by comparing the length of the tubular with a criteria; and instructions that cause the one or more processors to count the quantity of tubulars that meet the criteria. According to still yet another aspect, the plurality of instructions includes the instructions that cause the one or more processors to control the second system located at the wellsite using the calculated one or more dimensions; wherein the second system located at the wellsite and controlled using the calculated one or more dimensions includes one or more of the following: an iron roughneck, a pipe handler, a casing running tool, a top drive system, a hoisting system, and a mud tank farm. According to still yet another aspect, the second system includes the mud tank farm, the mud tank farm including one or more active mud tanks; and wherein the one or more dimensions include respective fluid levels in the one or more active mud tanks.

The present disclosure also introduces a method including generating, using one or more computer systems, a three-dimensional model of at least a portion of a drilling rig; calibrating a three-dimensional camera system to the three-dimensional model; calibrating a draw-works encoder of the drilling rig; monitoring, using the three-dimensional camera system, the motion of a component during the operation of the drilling rig; and recalibrating the draw-works encoder based on the monitoring of the motion of the component during the operation of the drilling rig. According to one aspect, the method includes monitoring counts registered by the encoder based on the motion of the component; calculating an absolute position of the component using three-dimensional imaging data received from the three-dimensional camera system; and calculating a distance moved by the component using the counts registered by the encoder. According to another aspect, recalibrating the draw-works encoder based on the monitoring of the motion of the component during the operation of the drill rig includes comparing the absolute position calculation with the distance moved calculation to determine if the calculations correlate; and recalibrating the draw-works encoder when the calculations do not correlate. According to yet another aspect, the component is one of a traveling block and a top drive; and wherein the three-dimensional camera system includes a first three-dimensional camera connected to the one of the traveling block and the top drive. According to still yet another aspect, the three-dimensional camera system includes a second three-dimensional camera connected to one of a mast and a rig floor.

The present disclosure also introduces an apparatus including a computer readable medium; and a plurality of instructions stored on the computer readable medium and executable by one or more processors, the plurality of instructions including instructions that cause the one or more processors to generate a three-dimensional model of at least a portion of a drilling rig; instructions that cause the one or more processors to calibrate a three-dimensional camera system to the three-dimensional model; instructions that cause the one or more processors to calibrate a draw-works encoder of the drilling rig; instructions that cause the one or more processors to monitor, using the three-dimensional camera system, the motion of a component during the operation of the drilling rig; and instructions that cause the one or more processors to recalibrate the draw-works encoder based on the monitoring of the motion of the component during the operation of the drilling rig. According to one aspect, the plurality of instructions further includes instructions that cause the one or more processors to monitor counts registered by the encoder; instructions that cause the one or more processors to calculate an absolute position of the component using three-dimensional imaging data received from the three-dimensional camera system; and instructions that cause the one or more processors to calculate a distance moved by the component using the counts registered by the encoder. According to another aspect, the instructions that cause the one or more processors to recalibrate the draw-works encoder based on the monitoring of the motion of the component during the operation of the drill rig include instructions that cause the one or more processors to compare the absolute position calculation with the distance moved calculation to determine if the calculations correlate; and instructions that cause the one or more processors to recalibrate the draw-works encoder when the calculations do not correlate. According to yet another aspect, the component is one of a traveling block and a top drive; and wherein the three-dimensional camera system includes a first three-dimensional camera connected to the one of the traveling block and the top drive. According to still yet another aspect, the three-dimensional camera system includes a second three-dimensional camera connected to one of a mast and a rig floor.

The present disclosure also introduces an apparatus including a drilling rig, including a rig floor; a traveling block; and a draw-works adapted to raise and lower the traveling block relative to the rig floor, the draw-works including an encoder to register counts during the lowering and raising of the traveling block; a first three-dimensional camera connected to the traveling block or another component adapted to be lowered and raised along with the traveling block; and a controller in communication with each of the encoder and the first three-dimensional camera; wherein the controller receives from the encoder data associated with the counts registered by the encoder during the lowering and raising of the traveling block, and further receives three-dimensional imaging data from the first three-dimensional camera; wherein the controller calculates an absolute position of the traveling block using the three-dimensional imaging data, and further calculates a distance moved by the traveling block using the data associated with the counts registered by the encoder; and wherein the controller compares the absolute position calculation with the distance moved calculation to determine if the calculations correlate. According to one aspect, the encoder is automatically recalibrated if the controller determines that the calculations do not correlate. According to another aspect, the apparatus includes a second three-dimensional camera connected to the rig floor or another component adapted to remain stationary while the traveling block is lowered and raised. According to yet another aspect, the apparatus includes a second three-dimensional camera; wherein the first three-dimensional camera employs a first three-dimensional sensing technology; and wherein the second three-dimensional camera employs a second three-dimensional sensing technology that is different from the first three-dimensional sensing technology.

The present disclosure also introduces a method including generating, using one or more computer systems, a predefined three-dimensional model of at least a portion of a wellsite; receiving three-dimensional imaging data sets from one or more three-dimensional cameras, the three-dimensional imaging data sets being associated with a control volume in which the portion of the wellsite is disposed; and augmenting the predefined three-dimensional model of the portion of the wellsite with the three-dimensional imaging data sets to thereby generate an augmented three-dimensional model of the portion of the wellsite. According to one aspect, the method includes controlling, using the augmented three-dimensional model of the portion of the wellsite, at least one system disposed in, or expected to be moved into, the control volume. According to another aspect, the at least one system includes one of the following: an iron roughneck, a pipe handler, a casing running tool, a top drive system, a hoisting system, and a mud tank farm. According to yet other aspects, the portion of the wellsite includes at least a portion of a drilling rig, at least a portion of a wellbore, or a combination thereof. According to still yet another aspect, the one or more three-dimensional cameras include two or more three-dimensional cameras, with at least one of the three-dimensional cameras employing a first three-dimensional sensing technology that is different from a second three-dimensional sensing technology employed by at least one other of the three-dimensional cameras.

The present disclosure also introduces an apparatus including a computer readable medium; and a plurality of instructions stored on the computer readable medium and executable by one or more processors, the plurality of instructions including instructions that cause the one or more processors to generate a predefined three-dimensional model of at least a portion of a wellsite; instructions that cause the one or more processors to receive three-dimensional imaging data sets from one or more three-dimensional cameras, the three-dimensional imaging data sets being associated with a control volume in which the portion of the wellsite is disposed; and instructions that cause the one or more processors to augment the predefined three-dimensional model of the portion of the wellsite with the three-dimensional imaging data sets to thereby generate an augmented three-dimensional model of the portion of the wellsite. According to one aspect, the plurality of instructions further includes instructions that cause the one or more processors to control, using the augmented three-dimensional model of the portion of the wellsite, at least one system disposed in, or expected to be moved into, the control volume. According to another aspect, the at least one system includes one of the following: an iron roughneck, a pipe handler, a casing running tool, a top drive system, a hoisting system, and a mud tank farm. According to yet another aspect, the one or more three-dimensional cameras include two or more three-dimensional cameras, with at least one of the three-dimensional cameras employing a first three-dimensional sensing technology that is different from a second three-dimensional sensing technology employed by at least one other of the three-dimensional cameras.

The present disclosure also introduces a method including providing a plurality of three-dimensional cameras so that each three-dimensional camera is configured to provide three-dimensional imaging of a control volume in which at least a portion of a wellsite is disposed, at least one of the three-dimensional cameras employing a first three-dimensional sensing technology that is different from a second three-dimensional sensing technology employed by at least one other of the three-dimensional cameras; receiving respective three-dimensional imaging data sets from the three-dimensional cameras, each of the three-dimensional imaging data sets being associated with the control volume in which the portion of the wellsite is disposed; generating a single three-dimensional model of the portion of the wellsite disposed in the control volume, wherein generating the single three-dimensional model includes merging the respective three-dimensional imaging data sets; and controlling, using the generated single three-dimensional model, at least one system disposed in, or expected to be moved into, the control volume. According to one aspect, the at least one system includes one of the following: an iron roughneck, a pipe handler, a casing running tool, a top drive system, a hoisting system, and a mud tank farm. According to another aspect, generating the single three-dimensional model further includes generating, using one or more computer systems, a predefined three-dimensional model of the portion of the wellsite; and augmenting the predefined three-dimensional model of the portion of the wellsite with the respective three-dimensional imaging data sets, wherein the respective three-dimensional imaging data sets are merged before, during or after the predefined three-dimensional model is augmented.

The present disclosure also introduces an apparatus including a computer readable medium; and a plurality of instructions stored on the computer readable medium and executable by one or more processors, the plurality of instructions including instructions that cause the one or more processors to receive respective three-dimensional imaging data sets from a plurality of three-dimensional cameras, each of the three-dimensional imaging data sets being associated with a control volume in which a portion of a wellsite is disposed, at least one of the three-dimensional cameras employing a first three-dimensional sensing technology that is different from a second three-dimensional sensing technology employed by at least one other of the three-dimensional cameras; instructions that cause the one or more processors to generate a single three-dimensional model of the portion of the wellsite disposed in the control volume, wherein the instructions that cause the one or more processors to generate the single three-dimensional model include instructions that cause the one or more processors to merge the respective three-dimensional imaging data sets; and instructions that cause the one or more processors to control, using the generated single three-dimensional model, at least one system disposed in, or expected to be moved into, the control volume. According to one aspect, the at least one system includes one of the following: an iron roughneck, a pipe handler, a casing running tool, a top drive system, a hoisting system, and a mud tank farm. According to another aspect, the instructions that cause the one or more processors to generate the single three-dimensional model further include instructions that cause the one or more processors to generate a predefined three-dimensional model of the portion of the wellsite; and instructions that cause the one or more processors to augment the predefined three-dimensional model of the portion of the wellsite with the respective three-dimensional imaging data sets, wherein the respective three-dimensional imaging data sets are merged before, during or after the predefined three-dimensional model is augmented.

The foregoing outlines features of several embodiments so that a person of ordinary skill in the art may better understand the aspects of the present disclosure. Such features may be replaced by any one of numerous equivalent alternatives, only some of which are disclosed herein. One of ordinary skill in the art should appreciate that they may readily use the present disclosure as a basis for designing or modifying other processes and structures for carrying out the same purposes and/or achieving the same advantages of the embodiments introduced herein. One of ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. § 1.72(b) to allow the reader to quickly ascertain the nature of the technical disclosure. It is submitted with the understanding that it will not be used to interpret or limit the scope or meaning of the claims.

Moreover, it is the express intention of the applicant not to invoke 35 U.S.C. § 112, paragraph 6, for any limitations of any of the claims herein, except for those in which the claim expressly uses the word "means" together with an associated function.

What is claimed is:

1. A method, which comprises:
   generating, using one or more computer systems, a three-dimensional model of at least an above-ground portion of a drilling rig;
   calibrating a three-dimensional camera system to the three-dimensional model;
   calibrating a draw-works encoder of the drilling rig;
   monitoring, using the calibrated three-dimensional camera system, three-dimensional motion of a component of the drilling rig during operation of the drilling rig;
   measuring a position of the component using the calibrated draw-works encoder;
   recalibrating the draw-works encoder based on the monitoring of the motion of the component during the operation of the drilling rig; and
   measuring the position of the component using the recalibrated draw-works encoder.

2. The method of claim 1, further comprising:
   monitoring counts registered by the encoder based on the motion of the component;
   calculating an absolute position of the component using three-dimensional imaging data received from the three-dimensional camera system; and
   calculating a distance moved by the component using the counts registered by the encoder.

3. The method of claim 2, wherein recalibrating the draw-works encoder based on the monitoring of the motion of the component during the operation of the drill rig comprises:
   comparing the absolute position calculation with the distance moved calculation to determine if the calculations correlate; and
   recalibrating the draw-works encoder when the calculations do not correlate.

4. The method of claim 1, wherein the component is one of a traveling block and a top drive of the drilling rig; and
   wherein the three-dimensional camera system comprises a first three-dimensional camera connected to the one of the traveling block and the top drive.

5. The method of claim 4, wherein the three-dimensional camera system comprises a second three-dimensional camera connected to one of a mast and a rig floor of the drilling rig.

6. An apparatus, comprising:
   a non-transitory computer readable medium; and
   a plurality of instructions stored on the non-transitory computer readable medium and executable by one or more processors, the plurality of instructions comprising:
   instructions that cause the one or more processors to generate a three-dimensional model of at least an above-ground portion of a drilling rig;
   instructions that cause the one or more processors to calibrate a three-dimensional camera system to the three-dimensional model;
   instructions that cause the one or more processors to calibrate a draw-works encoder of the drilling rig;
   instructions that cause the one or more processors to monitor, using the three-dimensional camera system, three-dimensional motion of a component of the drilling rig during operation of the drilling rig;
   instructions that cause the one or more processors to measure a position of the component using the calibrated draw-works encoder;
   instructions that cause the one or more processors to recalibrate the draw-works encoder based on the monitoring of the motion of the component during the operation of the drilling rig; and
   instructions that cause the one or more processors to measure the position of the component using the recalibrated draw-works encoder.

7. The apparatus of claim 6, wherein the plurality of instructions further comprises:
   instructions that cause the one or more processors to monitor counts registered by the encoder;
   instructions that cause the one or more processors to calculate an absolute position of the component using three-dimensional imaging data received from the three-dimensional camera system; and
   instructions that cause the one or more processors to calculate a distance moved by the component using the counts registered by the encoder.

8. The apparatus of claim 7, wherein the instructions that cause the one or more processors to recalibrate the draw-works encoder based on the monitoring of the motion of the component during the operation of the drill rig comprise:
instructions that cause the one or more processors to compare the absolute position calculation with the distance moved calculation to determine if the calculations correlate; and
instructions that cause the one or more processors to recalibrate the draw-works encoder when the calculations do not correlate.

9. The apparatus of claim 6, wherein the component is one of a traveling block and a top drive of the drilling rig; and
wherein the three-dimensional camera system comprises a first three-dimensional camera connected to the one of the traveling block and the top drive.

10. The apparatus of claim 9, wherein the three-dimensional camera system comprises a second three-dimensional camera connected to one of a mast and a rig floor of the drilling rig.

11. An apparatus, comprising:
an above-ground drilling rig, comprising:
a rig floor;
a traveling block; and
a draw-works adapted to raise and lower the traveling block relative to the rig floor, the draw-works comprising an encoder to register counts during the lowering and raising of the traveling block;
a first three-dimensional camera connected to the traveling block; and
a controller in communication with the encoder and the first three-dimensional camera;
wherein the controller receives from the encoder data associated with the counts registered by the encoder during the lowering and raising of the traveling block, and further receives three-dimensional imaging data from the first three-dimensional camera;
wherein the controller calculates an absolute three-dimensional position of the traveling block using the three-dimensional imaging data, and further calculates a distance moved by the traveling block using the data associated with the counts registered by the encoder; and
wherein the controller compares the absolute three-dimensional position calculation with the distance moved calculation to determine if the calculations correlate;
wherein the encoder is automatically recalibrated if the controller determines that the calculations do not correlate.

12. The apparatus of claim 11, further comprising a second three-dimensional camera connected to the rig floor or another component adapted to remain stationary while the traveling block is lowered and raised.

13. The apparatus of claim 11, further comprising a second three-dimensional camera;
wherein the first three-dimensional camera employs a first three-dimensional sensing technology; and
wherein the second three-dimensional camera employs a second three-dimensional sensing technology that is different from the first three-dimensional sensing technology.

14. A method, comprising:
generating, using one or more computer systems, a predefined three-dimensional model of at least a portion of a wellsite, the portion of the wellsite being located at and above the surface of the Earth;
receiving three-dimensional imaging data sets from one or more three-dimensional cameras, the three-dimensional imaging data sets being associated with a control volume in which the portion of the wellsite is disposed;
augmenting the predefined three-dimensional model of the portion of the wellsite with the three-dimensional imaging data sets to thereby generate an augmented three-dimensional model of the portion of the wellsite,
wherein the augmented three-dimensional model includes augmentations to one or more of:
absolute positions of one or more components within the wellsite,
positions of more or more moving objects,
constraints about which the one or more moving objects can move, or
axes around which the one or more moving objects can move; and
controlling, using the augmented three-dimensional model of the portion of the wellsite, movement of at least one system of the wellsite disposed in, or expected to be moved into, the control volume.

15. The method of claim 14, further comprising measuring, using the augmented three-dimensional model of the portion of the wellsite, the position of the at least one system of the wellsite within the control volume.

16. The method of claim 14, wherein the at least one system comprises one of the following: an iron roughneck, a pipe handler, a casing running tool, a top drive system, a hoisting system, and a mud tank farm.

17. The method of claim 14, wherein the portion of the wellsite comprises at least a portion of a drilling rig, at least a portion of a well bore, or a combination thereof.

18. The method of claim 14, wherein the one or more three-dimensional cameras comprise two or more three-dimensional cameras, with at least one of the three-dimensional cameras employing a first three-dimensional sensing technology that is different from a second three-dimensional sensing technology employed by at least one other of the three-dimensional cameras.

19. An apparatus, comprising:
a non-transitory computer readable medium; and
a plurality of instructions stored on the non-transitory computer readable medium and executable by one or more processors, the plurality of instructions comprising:
instructions that cause the one or more processors to generate a predefined three-dimensional model of at least a portion of a wellsite, the portion of the wellsite being located at and above the surface of the Earth;
instructions that cause the one or more processors to receive three-dimensional imaging data sets from one or more three-dimensional cameras, the three-dimensional imaging data sets being associated with a control volume in which the portion of the wellsite is disposed; and
instructions that cause the one or more processors to augment the predefined three-dimensional model of the portion of the wellsite with the three-dimensional imaging data sets to thereby generate an augmented three-dimensional model of the portion of the wellsite,
wherein the augmented three-dimensional model includes augmentations to one or more of:
absolute positions of one or more components within the wellsite,
positions of more or more moving objects,
constraints about which the one or more moving objects can move, or
axes around which the one or more moving objects can move; and instructions that that cause the one or more processors to control, using the augmented three-dimensional model of the portion of the wellsite, movement of at least one system of the wellsite disposed in, or expected to be moved into, the control volume.

20. The apparatus of claim 19, wherein the plurality of instructions further comprises instructions that cause the one or more processors to control, using the augmented three-dimensional model of the portion of the wellsite, the position of the at least one system of the wellsite within the control volume.

21. The apparatus of claim 20, wherein the at least one system comprises one of the following: an iron roughneck, a pipe handler, a casing running tool, a top drive system, a hoisting system, and a mud tank farm.

22. The apparatus of claim 19, wherein the one or more three-dimensional cameras comprise two or more three-dimensional cameras, with at least one of the three-dimensional cameras employing a first three-dimensional sensing technology that is different from a second three-dimensional sensing technology employed by at least one other of the three-dimensional cameras.

23. The apparatus of claim 19, wherein the one or more three-dimensional cameras include a flash, infrared imager, visual imager, thermal imager, or LIDAR.

24. The apparatus of claim 19, wherein the one or more processors are configured to stop one or more operations when a human or an unknown object strays into the control volume.

25. A method, comprising:
providing a plurality of three-dimensional cameras so that each three-dimensional camera is configured to provide three-dimensional imaging of a control volume in which at least a portion of a wellsite is disposed, at least one of the three-dimensional cameras employing a first three-dimensional sensing technology that is different from a second three-dimensional sensing technology employed by at least one other of the three-dimensional cameras, the portion of the wellsite being located at and above the surface of the Earth;
receiving three-dimensional imaging data sets from the three-dimensional cameras, each of the three-dimensional imaging data sets being associated with the control volume in which the portion of the wellsite is disposed;
generating a single three-dimensional model of the portion of the wellsite disposed in the control volume based on three-dimensional data sets from both the first and second three-dimensional sensing technology, wherein generating the single three-dimensional model comprises merging the respective three-dimensional imaging data sets; and
controlling, using the generated single three-dimensional model, at least one system disposed in, or expected to be moved into, the control volume,
wherein the single three-dimensional model includes one or more of:
absolute positions of one or more components within the wellsite,
motion of one or more components within the wellsite,
a distance moved by one or more components within the wellsite,
a calibration of one or more encoders within the wellsite, or
an identity of one or more components within the wellsite.

26. The method of claim 25, wherein the at least one system comprises one of the following: an iron roughneck, a pipe handler, a casing running tool, a top drive system, a hoisting system, and a mud tank farm.

27. The method of claim 25, wherein generating the single three-dimensional model further comprises:
generating, using one or more computer systems, a predefined three-dimensional model of the portion of the wellsite; and
augmenting the predefined three-dimensional model of the portion of the wellsite with the respective three-dimensional imaging data sets, wherein the respective three-dimensional imaging data sets are merged before, during or after the predefined three-dimensional model is augmented.

28. An apparatus, comprising:
a non-transitory computer readable medium; and
a plurality of instructions stored on the non-transitory computer readable medium and executable by one or more processors, the plurality of instructions comprising:
instructions that cause the one or more processors to receive respective three-dimensional imaging data sets from a plurality of three-dimensional cameras, each of the three-dimensional imaging data sets being associated with a control volume in which a portion of a wellsite is disposed, at least one of the three-dimensional cameras employing a first three-dimensional sensing technology that is different from a second three-dimensional sensing technology employed by at least one other of the three-dimensional cameras, the portion of the wellsite being located at and above the surface of the Earth;
instructions that cause the one or more processors to generate a single three-dimensional model of the portion of the wellsite disposed in the control volume based on three-dimensional data sets from both the first and second three-dimensional sensing technology, wherein the instructions that cause the one or more processors to generate the single three-dimensional model comprise instructions that cause the one or more processors to merge the respective three-dimensional imaging data sets; and
a controller in contact with at least one system associated with the wellsite;
wherein the plurality of instructions further comprises instructions that cause the one or more processors to control, with the controller using the generated single three-dimensional model, the at least one system disposed in, or expected to be moved into, the control volume,
wherein the single three-dimensional model includes one or more of:
absolute positions of one or more components within the wellsite,
motion of one or more components within the wellsite,
a distance moved by one or more components within the wellsite,
a calibration of one or more encoders within the wellsite, or
an identity of one or more components within the wellsite.

29. The apparatus of claim 28, wherein the at least one system comprises one of the following: an iron roughneck, a pipe handler, a casing running tool, a top drive system, a hoisting system, and a mud tank farm.

30. The apparatus of claim 28, wherein the instructions that cause the one or more processors to generate the single three-dimensional model further comprise:

instructions that cause the one or more processors to generate a predefined three-dimensional model of the portion of the wellsite; and instructions that cause the one or more processors to augment the predefined three-dimensional model of the portion of the wellsite with the respective three-dimensional imaging data sets, wherein the respective three-dimensional imaging data sets are merged before, during or after the predefined three-dimensional model is augmented.

31. The apparatus of claim 19 wherein the one or more three-dimensional cameras are configured to generate three-dimensional imaging data sets in conditions of dust, smoke, or fog.

* * * * *